United States Patent [19]
Allman

[11] Patent Number: 5,512,814
[45] Date of Patent: Apr. 30, 1996

[54] VOLTAGE REGULATOR INCORPORATING CONFIGURABLE FEEDBACK AND SOURCE FOLLOWER OUTPUTS

[75] Inventor: Gary L. Allman, San Jose, Calif.

[73] Assignee: Crosspoint Solutions, Inc., Milpitas, Calif.

[21] Appl. No.: 206,566

[22] Filed: Mar. 4, 1994

Related U.S. Application Data

[62] Division of Ser. No. 831,211, Feb. 7, 1992, Pat. No. 5,336,986.

[51] Int. Cl.⁶ .................................................. G05F 1/577
[52] U.S. Cl. .......................... 323/267; 323/269; 323/280; 323/281; 323/314
[58] Field of Search .................................. 323/267, 269, 323/273, 274, 280, 281, 314, 315, 316

[56] References Cited

U.S. PATENT DOCUMENTS

| | | | |
|---|---|---|---|
| 3,962,592 | 6/1976 | Thommen et al. | 323/315 |
| 4,437,023 | 3/1984 | Gill | 323/315 |
| 4,445,083 | 4/1984 | DeFalco | 323/273 |
| 4,814,688 | 3/1989 | Colles | 323/317 |
| 4,868,482 | 9/1989 | O'Shaughnessy et al. | 323/313 |
| 4,950,921 | 8/1990 | Takada | 307/276.1 |
| 4,965,510 | 10/1990 | Kriedt et al. | 323/315 |
| 5,157,322 | 10/1992 | Llewellyn | 323/315 |
| 5,177,431 | 1/1993 | Smith et al. | 323/349 |
| 5,336,986 | 8/1994 | Allman | 323/268 |

FOREIGN PATENT DOCUMENTS

| | | | |
|---|---|---|---|
| 62-150935 | 7/1987 | Japan | 323/281 |

*Primary Examiner*—Jeffrey L. Sterrett
*Attorney, Agent, or Firm*—Townsend and Townsend and Crew

[57] ABSTRACT

A voltage regulator especially adaptable for use with field-programmable gate arrays (FPGAs). The voltage regulator includes a frequency compensated differential amplifier, a configurable feedback network for setting the gain of the voltage regulator, and a plurality of source follower devices for driving the feedback network and providing a regulated supply voltage. A bandgap generator may also be provided for generating a reference bias voltage that is independent of temperature.

10 Claims, 6 Drawing Sheets

VOLTAGE REGULATOR INCORPORATING CONFIGURABLE FEEDBACK AND SOURCE FOLLOWER OUTPUTS

This is a division of application Ser. No. 07/831,211 filed, Feb. 7, 1992, now U.S. Pat. No. 5,336,986.

BACKGROUND OF THE INVENTION

The present invention relates to a voltage regulator and more specifically to a voltage regulator suitable for a field-programmable gate array (FPGA) semiconductor device. It is contemplated that programming of the device is to be accomplished by application of a programming voltage to several of several thousand fuse elements on the device.

FPGAs provide extreme flexibility in implementing an electrical circuit because the logical interconnection of logic elements can be configured without additional fabrication process steps. Indeed, FPGAs can be configured with a small programming box consisting of little more than a computer controlled high voltage generator. Accordingly, because of the ease in changing the logical configuration of the logic elements, FPGAs are recognized as a time and resource efficient method for verifying the design of the electrical circuit.

However, for FPGAs using low resistance polysilicon or amorphous silicon fuses, the operation of the device at normal operating voltage can induce stress that will ultimately alter the resistance of the fuses and cause the device to operate improperly. As a consequence, there is a constraint on the magnitude of the power supply voltage applied to the core or nucleus logic elements. It is thus necessary to ensure that the power supply voltage is sufficient to properly operate the FPGA device without unnecessarily inducing stress to the fuses. However, to ensure the FPGA is field programmable, provisions must be made that permit the application of a programming voltage to the core logic. What is needed is a voltage regulator for a FPGA that is capable of regulating the core or nucleus logic power supply while permitting field programming of the device.

SUMMARY OF THE INVENTION

The present invention provides a voltage regulator for a field-programmable gate array (FPGA). The voltage regulator of the present invention rapidly generates an operating voltage for the core or nucleus logic elements upon application of external power. To prevent degradation of the fuses, the magnitude of the core voltage may be set to a level less than the level on the external voltage buss by programming a resistor network. In this manner, the core voltage of a FPGA can be set to a level that provides maximum performance with minimum power consumption or, alternatively, permits propagation delays and switching rates to be adjusted so as to compensate for die to die variation.

The present voltage regulator produces a voltage output that drives the gate of a distributed NMOS transistor configured as a source follower. The source of the NMOS transistor acts as the regulated supply voltage for the core or internal logic of a semiconductor circuit. The regulated supply voltage is of lower magnitude than the external power supplied to the voltage regulator. It is compensated for temperature and process variations, external supply variations and bulk semiconductor body effects. The lower magnitude of the regulated supply voltage advantageously decreases the operating current of the core logic elements and provides minimum variation in propagation delays when the external supply voltage fluctuates.

In addition to the voltage regulator, the present invention further comprises a bandgap generator, frequency compensation means and associated buffer circuitry. This advantageous combination may be implemented onto any MOS semiconductor device. However, one skilled in the art may easily adapt the circuits disclosed herein for other semiconductor technologies.

The bandgap generator generates two intermediate reference voltages and a bias current, which are supplied to the voltage regulator circuit. The bandgap generator includes both CMOS devices and bipolar devices in a manner that references the output voltages to $V_{ss}$ rather than $V_{cc}$. In this manner, the intermediate reference voltages are isolated from noise and ripple carried by the external source. Further, the bandgap generator uses a technique that minimizes variation of the intermediate reference voltage over the operating temperature range of the FPGA device.

It is common for a FPGA to be manufactured in more than one wafer fabrication facility. As is well known, wafer fabrication processes vary from one facility to another in the bandgap generator even when the processes are supposedly identical. Such variation may degrade the performance characteristics of the bipolar devices sufficient to cause the voltage regulator to operate with less than optimal voltage output levels. To compensate for such process variation in devices fabricated at different wafer fabrication facilities, the voltage regulator is configurable first as a true voltage regulator or, alternatively, as a pseudo-voltage regulator.

The voltage regulator comprises an operational transconductance amplifier with a single gain stage followed by an NMOS source follower. The amplifier is frequency compensated at the high impedance output of the amplifier by a capacitor coupled to $V_{ss}$. The voltage regulator further includes circuitry to improve performance during the power-up sequence and to permit tuning of the voltage regulator's output level to compensate for load or process variations.

The invention will be better understood upon reference to the following detailed description in connection with the accompanying drawings.

DESCRIPTION OF THE PREFERRED EMBODIMENT

Figure 1:
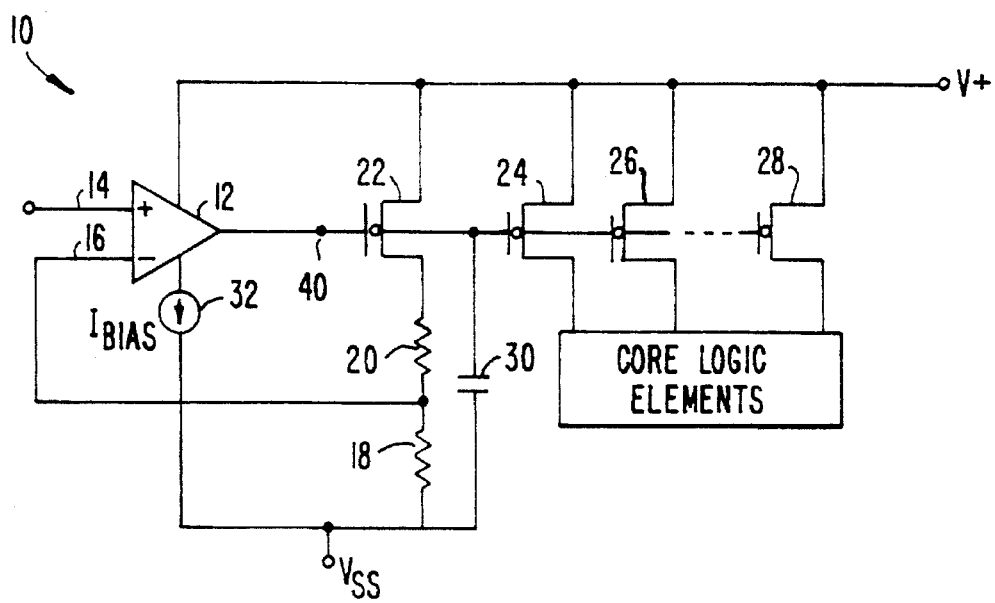
FIG. 1 is an electrical circuit diagram of a portion of the voltage regulator circuit for generating a regulated core voltage output.

Referring now to FIG. 1 of the drawings, one embodiment of a voltage regulator 10 in accordance with the present invention is shown. Voltage regulator 10 may be included as part of a semiconductor integrated circuit which, in the preferred embodiment, is fabricated according to known complementary metal oxide semiconductor (CMOS) fabrication processes.

As a whole, this invention makes possible a stable regulated voltage output to the core or nucleus logic circuit elements. The design of voltage regulator 10 compensates for process variations inherently introduced when a common design is manufactured at more than one fabrication facility or foundry. The present voltage regulator 10 further compensates for variations in the power requirements of the core or nucleus logic circuit such that voltage regulator 10 is particularly adapted for use on a field programmable gate array (FPGA) having thousands of fuses that are voltage programmable. A decrease in voltage stress on non-programmed fuses is one especially important advantage of the present invention provided by regulator 10.

In FIG. 1, voltage regulator 10 according to the present invention is shown. Voltage regulator 10 comprises an operational transconductance amplifier 12 with a single differential gain stage which is illustrated as having a non-inverting input 14 and an inverting input 16 connected to a voltage divider network comprising resistors 18 and 20. A voltage biases input 14, the generation of which is discussed below in conjunction with the band-gap generator circuit. The high impedance output of amplifier 12 provides a voltage level at node 40 and the gate of transistor 22, which is an n-channel source follower. Transistor 22 buffers the output of amplifier 12 and drives the divider network.

Amplifier 12 also drives the gates of a plurality of additional transistors 24, 26 and 28. Transistors 24, 26 and 28 are each configured as source followers and power, or drive, the core or internal logic circuits constructed on the semiconductor device. In the preferred embodiment, there is no feedback of the actual core voltage to the regulator. Accordingly, the actual core voltage will vary as the core current or load varies. However, since transistors 24–28 each have a large channel width-to-length ratio, the actual voltage variation can be kept to a minimum even without feedback.

Although only three transistors 24–28 are shown in FIG. 1, it is to be understood that the actual number and dimensions of such transistors will vary depending on design considerations, such as total current sourced to the core or internal logic and logic partitioning schemes. Preferably, transistors 22–28 are native NMOS transistors which are more conductive, low threshold devices. Native NMOS transistors are selected transistors that are masked and do not receive the threshold adjustment implant that other NMOS transistors receive. Thus, their threshold voltage is approximately 0.8 volts lower than that of the implanted NMOS devices. In the drawings native NMOS transistors are indicated by a circle between the gate and channel of an NMOS transistor symbol.

A load capacitor 30, coupled between the high impedance output of amplifier 12 and $V_{ss}$, provides frequency compensation. The value of capacitor 30 may be calculated as the minimum capacitance at node 40 sufficient to insure a stable output of amplifier 12 upon removal of the intrinsic capacitance associated with the core logic.

The operating power of amplifier 12 is determined by bias current, $I_{BIAS}$, sourced by a current source 32. To reduce power, it is desirable to set $I_{BIAS}$ at a value that is as small as practical and, in one preferred embodiment, $I_{BIAS}$ is set at about 40 μa. While operating voltage regulator 10 at low power is particularly advantageous in CMOS circuits, it is possible under certain operating conditions, such as during initial power-up of the device, that amplifier 12 will be slew-rate limited. This problem occurs when the maximum rate of voltage change at the output of amplifier 12 is insufficient to rapidly respond to the application of power to the semiconductor integrated circuit, or to the switching of the core to the regulated voltage from some other level. Such a slew-rate limitation is brought about by the inability of amplifier 12 to instantaneously drive the capacitive load of the core logic and capacitor 30.

One method to minimize slew-rate limitations while preserving the advantages provided by steady-state low power operation of voltage regulator is to temporarily increase the current available to drive the capacitive load. The present invention provides for such a voltage regulator circuit 33 as shown in FIG. 2.

In addition to the circuitry associated with amplifier 12, voltage regulator 33 further includes a second operational transconductance amplifier 34. The output of amplifier 34 is connected in parallel with the output of amplifier 12 at node 40.

Since the magnitude of the voltage level variation at node 40 is greatest upon initial power-up, it is preferable that amplifiers 12 and 34 operate in parallel to increase the slew rate of the voltage level at node 40 during this period. The current provided by amplifier 34 supplements the current provided by amplifier 12 in charging the capacitance associated with node 40. Once the steady-state voltage regulator output level is reached, amplifier 34 may be switched "off" so as to decrease steady-state power consumption. In this manner, the regulated voltage level supplied to the core or internal logic circuit may be rapidly increased to an operating level without significant increase in steady-state power consumption.

Figure 2:
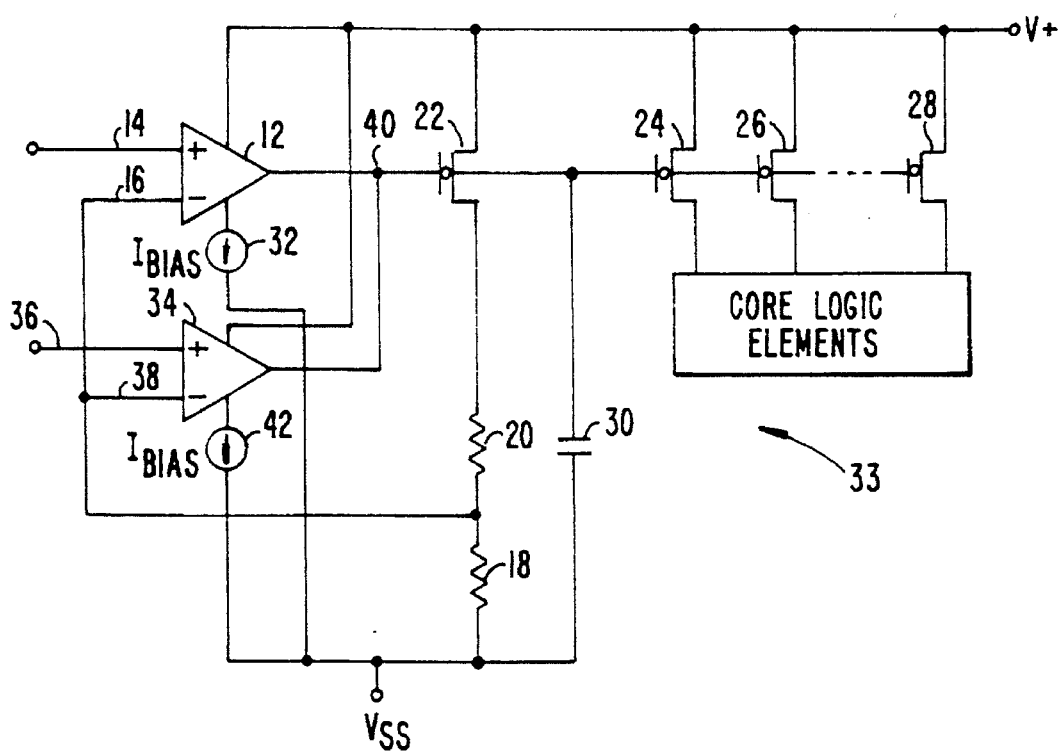
FIG. 2 is an electrical circuit diagram of a second embodiment of the voltage regulator circuit of FIG. 1 in accordance with the present invention.
Figure 3:
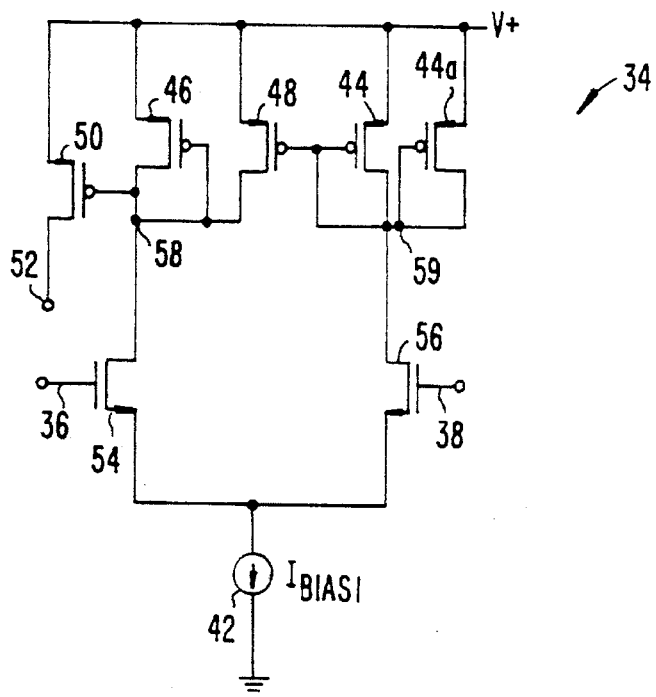
FIG. 3 is a electrical circuit diagram of one amplifier shown in FIG. 2.

As shown in FIG. 2, amplifier 34 has a non-inverting input 36 coupled to a reference voltage source (not shown) and an inverting input 38 connected to input 16 of amplifier 12 and to the common node between resistors 18 and 20. The supplementary current provided by amplifier 34 is proportional to the magnitude of the steady-state bias current, $I_{BIAS1}$, of a current source 42. Since amplifier 34 in steady state provides no output current, and $I_{BIAS1}$ can be less than $I_{BIAS}$, it does not significantly increase steady-state power consumption. During power-up however, amplifier 34 provides current to the load capacitor 30 that is proportional to $I_{BIAS1}$. The actual current is determined by an accurate ratio set by the relative sizes of transistors in amplifier 34 as is shown in FIG. 3. This proportional ratio may be quantified as a dimensionless constant $K_{34}$.

With the regulator circuits of either FIG. 1 or FIG. 2, the core logic elements are powered with a voltage that is less in magnitude than the voltage level on the V+buss. This lower magnitude decreases the operating current of the core logic elements. With this arrangement, switching and propagation speed do not vary as the voltage on the V+buss varies because of the effect of regulation provided by amplifier 12.

One preferred circuit schematic representation of amplifier 34 is shown in FIG. 3. Amplifier 34 comprises p-channel MOSFET transistors 44–50, an output 52 which is connected to node 40 (FIG. 2), n-channel transistors 54 and 56, the gates of which define differential input 36 and 38, respectively, and current source 42. The embodiment of amplifier 34 shown in FIG. 3 has a low differential input offset voltage and a controlled maximum output current which creates a controlled lower bound on the output rise time (i.e., the output does not rise instantaneously).

The operation of regulator 33 will be discussed referring to FIGS. 2 and 3. Upon initial application of power to the device, the voltage at input 36 is greater than the voltage at node 38 which is derived from the voltage at node 40. Due to this initial imbalance in the voltages at inputs 36 and 38, transistor 56 is "off", node 59 is pulled high and current flows through transistors 46 and 54. Transistor 50 is biased in the conducting mode and provides current to node 40. The supplementary current provided by amplifier 34 is determined by the relative sizes of transistors 46 and 50 and the magnitude of the bias current, $I_{BIAS}$, sourced by current source 42. Transistors 46 and 50 act as a current mirror. Transistor 50 is preferably dimensioned significantly larger than transistor 46 to proportionally amplify the current at output 52 relative to $I_{BIAS1}$ so long as the voltage at input 38 is less than the voltage at input 36.

Transistors 44 and 48 are also configured as a current mirror, having their gates tied in common. When the voltage at input 38 rises sufficiently to bias transistor 56 in the conducting region, the voltage at node 59 decreases and transistor 44 conducts current. Transistor 48 mirrors the current in transistor 44 pulling node 58 high. As transistor 54 turns "off", the current mirrored by transistor 48 ensures the switching of transistor 50 from a conducting state to a non-conducting state. In this manner, a more positive shutoff of transistor 50 is obtained.

Specifically, since the gate of transistor 48 is connected to the drain of transistor 44, transistor 48 is biased in a low resistance "on" state. Thus, node 58 is pulled high, transistor 50 is biased in the completely "off" state and any current at output 52 is negligible. With the circuit configuration shown in FIG. 3, transistor 50 is relatively immune to noise transients on the V+ voltage bus and it is unlikely that a large source current will be erroneously provided to load capacitor 30 at node 40.

In order to ensure a low input offset voltage for amplifier 34, the sizing of transistors 44, 46 and 48 is critical. Specifically, the sum of the widths of transistors 44 and 44a must equal the sum of the width of transistors 46 and 48. Further, the lengths of transistors 44, 44a, 46 and 48 must be equal.

In view of the above it should be clear that the source current which is supplied by amplifier 34 supplements the $I_{BIAS}$ current provided by amplifier 12 during the turn-on period immediately after power-up. Although the source current is large (i.e., $K_{34}$ times $I_{BIAS1}$), the current is sourced for only a short period and then is switched off so that steady-state power consumption is low once load capacitor 30 is fully charged.

Another especially preferred embodiment of the invention provides for the voltage biasing input 36 to be about 5% less than the voltage level at input 14. In this embodiment, the high level output current of amplifier 34 is switched "off" when load capacitance is about 95% charged.

The advantage of amplifier 34 is clearly apparent when the slew rate of the embodiment of FIG. 2 is compared to the embodiment of FIG. 1. By way of example, the rise time of the embodiment of FIG. 1 is:

$$t_{rise} = \frac{V_{out} * C_L}{I_{BIAS}} \qquad (1)$$

In this embodiment, steady-state supply current for amplifier 12 set by current source 32 is equal to $I_{BIAS}$. However, if the ratio of $I_{BIAS}$ to $I_{BIAS1}$ is 10:1 and $K_{34}$ is set to 100, the time for the voltage at node 40 to reach its final value with the embodiment of FIG. 2 is:

$$t_{rise} = \frac{0.95 V_{out} * C_L}{I_{BIAS} + 100 * I_{BIAS1}} + \frac{0.05 V_{out} * C_L}{I_{BIAS}} \qquad (2)$$

Equation 2 reduces to:

$$t_{rise} = 0.136 \frac{V_{out} * C_L}{I_{BIAS}} \qquad (3)$$

and the steady-state supply current is equal to 1.1 times $I_{BIAS}$.

It should be apparent to one skilled in the art that the output rise time or slew rate of the embodiment of FIG. 2 is significantly improved by the addition of amplifier 34 with only a marginal increase in steady-state current consumption.

Figure 4:
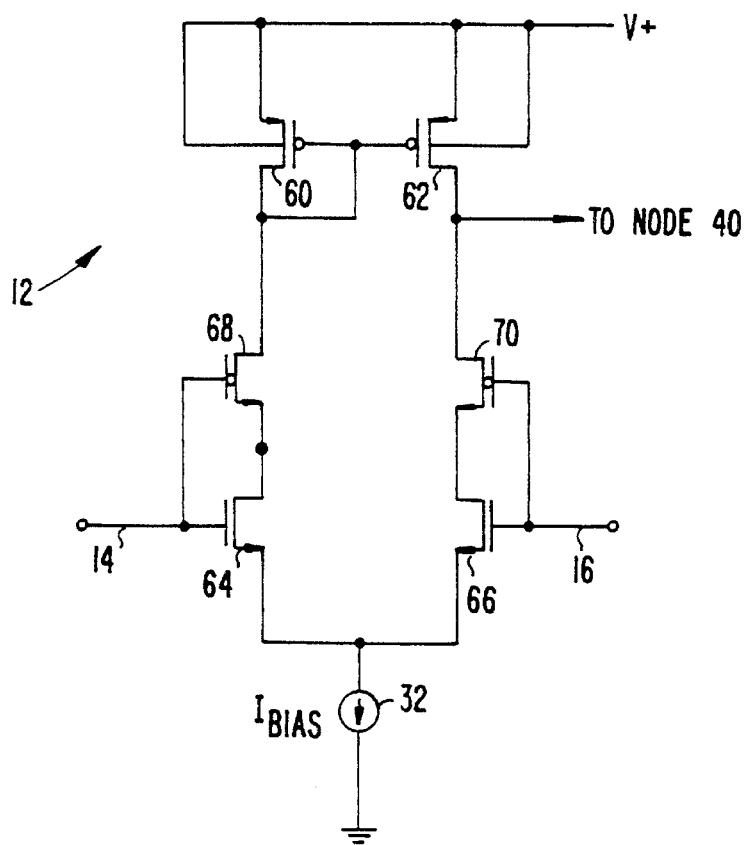
FIG. 4 is an electrical circuit diagram of the amplifier shown in FIG. 1.

Referring now to FIG. 4, amplifier 12 is shown in greater detail. P-channel transistors 60 and 62 are configured as a current mirror each having its source connected to V+. The drains of transistors 60 and 62 are coupled to the drains of NMOS transistors 64 and 66 by a pair of cascode input transistors 68 and 70. The gates of transistors 64 and 66 define the differential inputs 14 and 16 of amplifier 12 and the sources are coupled to current source 32.

In the design of high-gain amplifiers, cascoding is widely used to increase output impedance and improve matching of device currents. As configured in the present invention, input pair cascode transistors 68 and 70 do not require the addition of a bias gate voltage. Further, when compared to amplifiers that implement floating bias cascoding of the input devices on the differential inputs, the present invention requires fewer components and less steady-state current.

In the present invention transistors 68 and 70 have a more negative threshold voltage than transistors 64 and 66. That is:

$$V_T(68) = V_T(70) < V_T(64) = V_T(66) \qquad (4)$$

By properly selecting $I_{BIAS}$ and the width-to-length ratio of transistors 68 and 70, transistors 64 and 66 are guaranteed to be saturated. Thus, transistor 68 acts as a self-biased cascode stage for transistor 64 while transistor 70 acts as a self-biased cascode stage for transistor 66. In one preferred embodiment, transistors 68 and 70 are native NMOS enhancement devices that each have the same width as corresponding transistors 64 and 66.

The difference between the native n-channel threshold voltage and the adjusted n-channel threshold voltage is $\Delta V_T$ where:

$$\Delta V_T = V_T(64) - V_T(68) \qquad (5)$$

If the dimensions of transistors 64 and 66 are equal, the current through transistor 64, $I_D(64)$, is equal to $I_{BIAS}/2$. For transistor 64 to be saturated, $$V_D(64) \geq V_G(64) - V_T(64) \qquad (6)$$

where $V_D(64)$, $V_G(64)$ and $V_T(64)$ represent the drain, gate and threshold voltages, respectively, of transistor 64. However, since $$V_D(64) = V_G(68) - V_T(68) - \sqrt{\frac{I_D(68)}{\left(\frac{\mu C_{ox}}{2}\right)\left(\frac{W(68)}{L(68)}\right)}} \qquad (7)$$

where the symbol $\mu$ represents mobility or the ease with which a current carrier travels, $C_{ox}$ represents gate oxide capacitance, W(68) is the width of transistor 68 and L(68) is the length of transistor 68

$$I_D(68) = \frac{I_{BIAS}}{2} \tag{8}$$

and $$V_G(68) = V_G(64) \tag{9}$$

by combining equations 5–9:

$$V_G(64) - V_T(68) - \sqrt{\frac{I_D(68)}{(\mu C_{ox})\left(\frac{W(68)}{L(68)}\right)}} > V_G(64) - V_T(64) \tag{10}$$

or $$\Delta V_T > \sqrt{\frac{I_D(68)}{(\mu C_{ox})\left(\frac{W(68)}{L(68)}\right)}} \tag{11}$$

If this criterion is met, transistor 64 will be saturated.

It is to be understood that transistor 70 has similar dimensions relative to transistor 66. If native NMOS transistors are not available, one skilled in the art could replicate the function of transistors 68 and 70 using depletion mode devices. Further, transistors 68 and 70 need not be of the same conductivity type in order to realize the advantages associated with this aspect of the present invention although the adjusted and unadjusted threshold voltages of the native NMOS devices are most useful.

Figure 5:
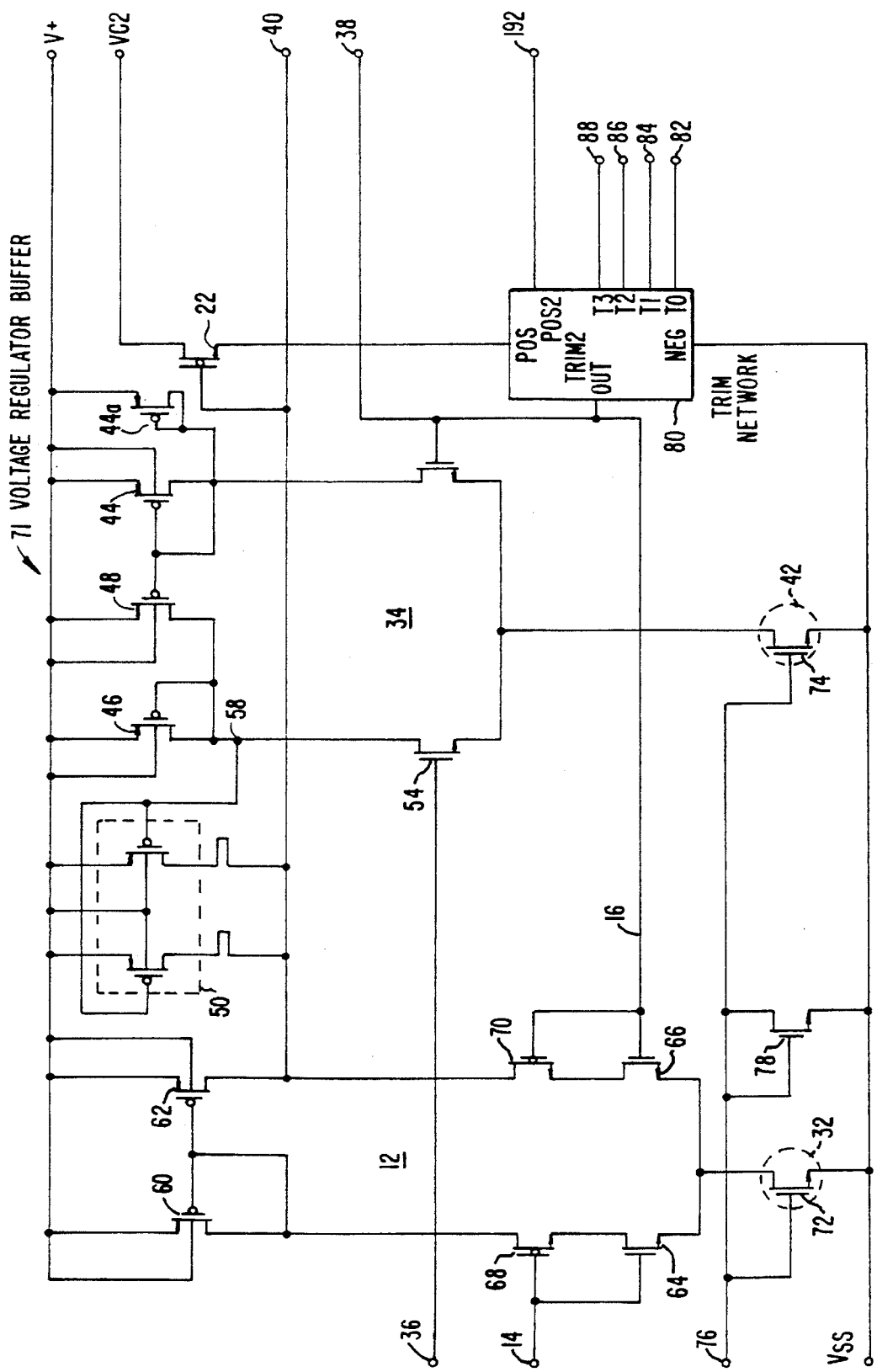
FIG. 5 illustrates a detailed electrical circuit diagram of the embodiment shown in FIG. 2.

Referring now to FIG. 5, a voltage regulator buffer 71 is shown comprising amplifiers 34 and 12. A transistor 78, configured as a diode with its drain and gate connected to node 76 and its source to $V_{ss}$, couples node 76 to $V_{ss}$. A bias current into node 76 is mirrored from transistor 78 to transistors 72 and 74 which act as current sources 32 and 42 respectively. The currents, $I_{BIAS}$ and $I_{BIAS1}$, can be accurately controlled by setting the ratio of the sizes of transistors 72 and 74 relative to that of transistor 78. Resistors 20 and 18 are now depicted as a trim network 80 which is discussed in conjunction with FIG. 6. Control terminals 82–88 are driven by digital signals so that unique values may be chosen for resistors 18 and 20.

Figure 6:
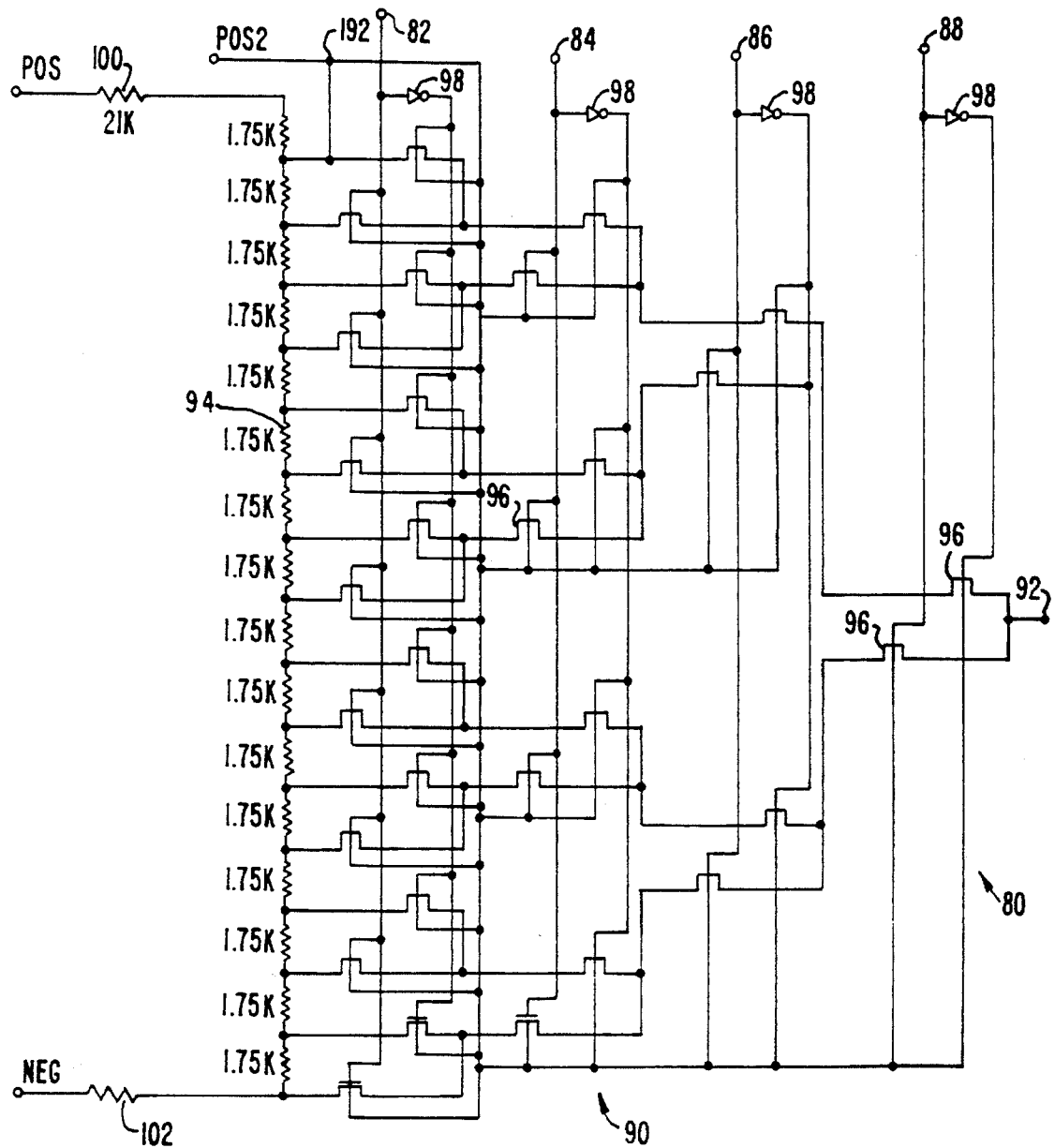
FIG. 6 is an electrical circuit diagram of a resistor tree circuit within the embodiment of this invention shown in FIG. 5.

Referring to the trim network 80 shown in FIG. 6, it is possible to select a tap point from a series resistors. In this manner, the values of resistors 18 and 20 can be adjusted to compensate for process and load variation. External signals supplied at wafer probe testing to control terminals 82–88 configure the PMOS tree decode circuit, depicted generally at 90. The output of trim network 80 is taken from tree decode circuit 90 at output tap 92 and coupled to inputs 16 and 38 of amplifiers 12 and 34, respectively. Since no steady-state current flows through the transistors 96 of tree decode circuit 90, the dimensions of the individual transistors 96 may be the minimum allowed by the design rules of the specific process. To decrease body effect on threshold voltage, the N-well, in which the PMOS transistors 96 of the tree decode circuit 90 are constructed, is connected to the highest decoded resistor tap, rather than to V+.

In one preferred embodiment, the resistor series comprises sixteen 1.75 Kohm resistors 94 coupled between a 21 Kohm resistor 100 and a 61.25 Kohm resistor 102. Resistor 100 couples the source of transistor 22 (FIG. 5) to resistors 94 while resistor 102 couples resistors 94 to $V_{ss}$. Depending on the logic levels applied at control inputs 82–88, resistor 18 can vary from between 22.75 Kohms and 49 Kohms. Similarly, resistor 20, in this embodiment can vary from between 87.5 Kohms and 61.25 Kohms.

To compensate for process variations and random mismatch of components, the magnitude of the regulated voltage is adjustable. On FPGA circuits, such adjustment is readily accomplished by adding four programmable elements, such as fuses, and appropriate digital control circuitry. The optimum setting for a particular product or foundry can also be determined and the control signals tied to the appropriate logic level on all die using metal masks.

HIGH GAIN CASCODE MIRROR

Figure 7:
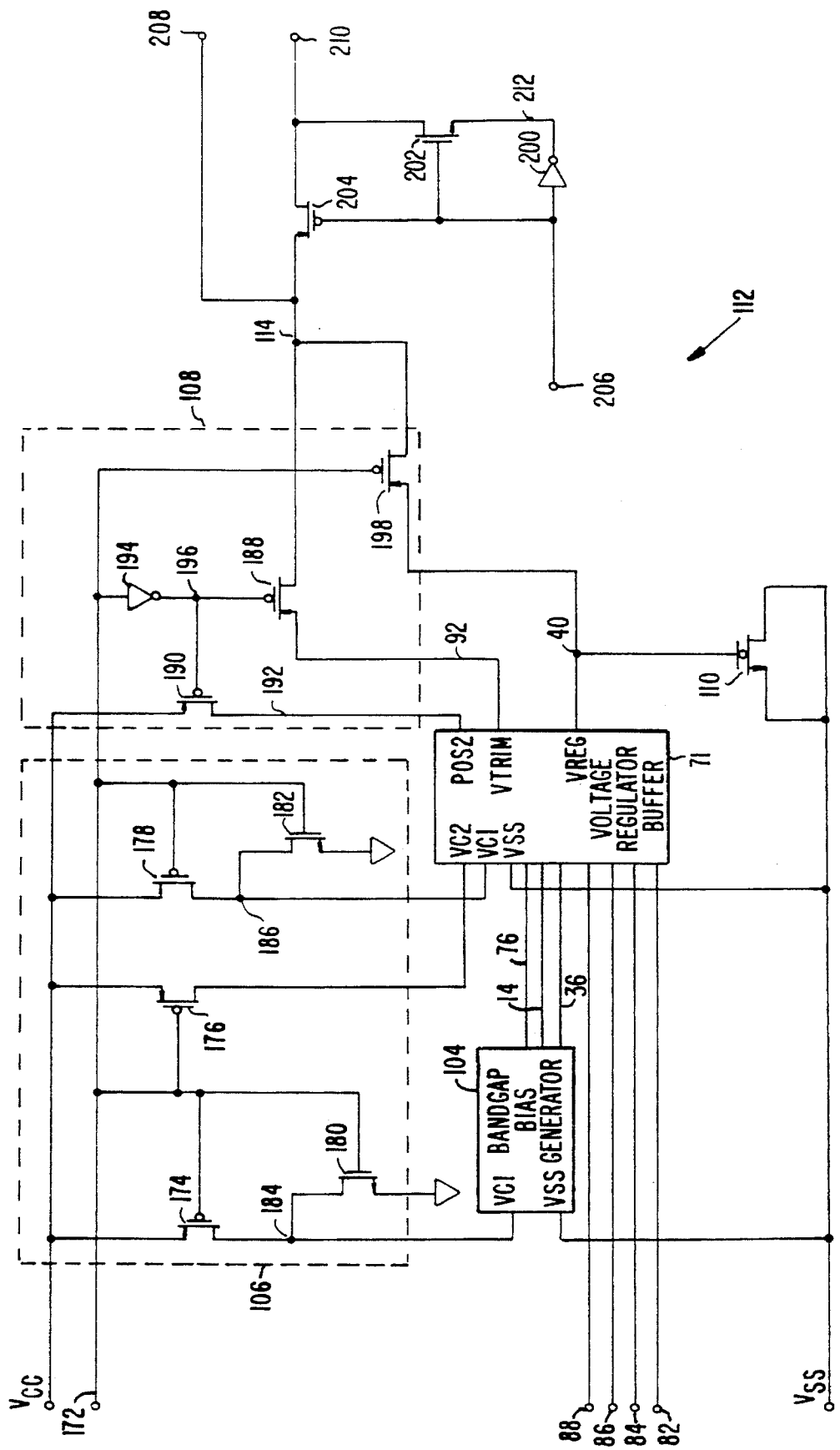
FIG. 7 is an electrical circuit diagram of one circuit implementing the present invention.

In FIG. 7, another especially preferred circuit embodiment incorporating voltage regulator 71 is shown. In this embodiment, voltage regulator 71 is coupled to a bandgap bias generator 104, power switching circuitry 106, output switching circuitry 08 and a frequency compensating capacitor 110. The combination of voltage regulator buffer 71, bandgap bias generator 104, power switching circuitry 106, output switching circuitry 108 and capacitor 110 is collectively hereafter referred to as regulator circuit 112.

Regulator circuit 112 produces a voltage at a node 114 that drives the gate of a large distributed NMOS source follower (not shown) in the circuit core of a semiconductor device. The source of the NMOS transistor drives the regulated supply voltage bus for the core logic of the semiconductor device. The supply voltage at node 114 is compensated for temperature, external supply, threshold voltage, body effects, and process variations, as is discussed more fully below.

Neither the regulated supply voltage at node 114 nor the source of the distributed NMOS transistor are directly sensed or adjusted to compensate for the current drawn by the core logic. Thus, the regulated supply voltage at node 114 will not vary even though the voltage at the source of each transistor 24–28 (FIG. 1) will vary depending upon steady-state core current of the circuit logic driven by each transistor.

To adjust the voltage at node 114, voltage regulator buffer 71 includes trim network 80 (FIG. 5) with control terminals 82–88. Control terminals 82–88 permit the voltage at node 114 to be set to a tolerance of approximately ±60 mV to compensate for variations in process and expected steady-state core current.

Figure 8:
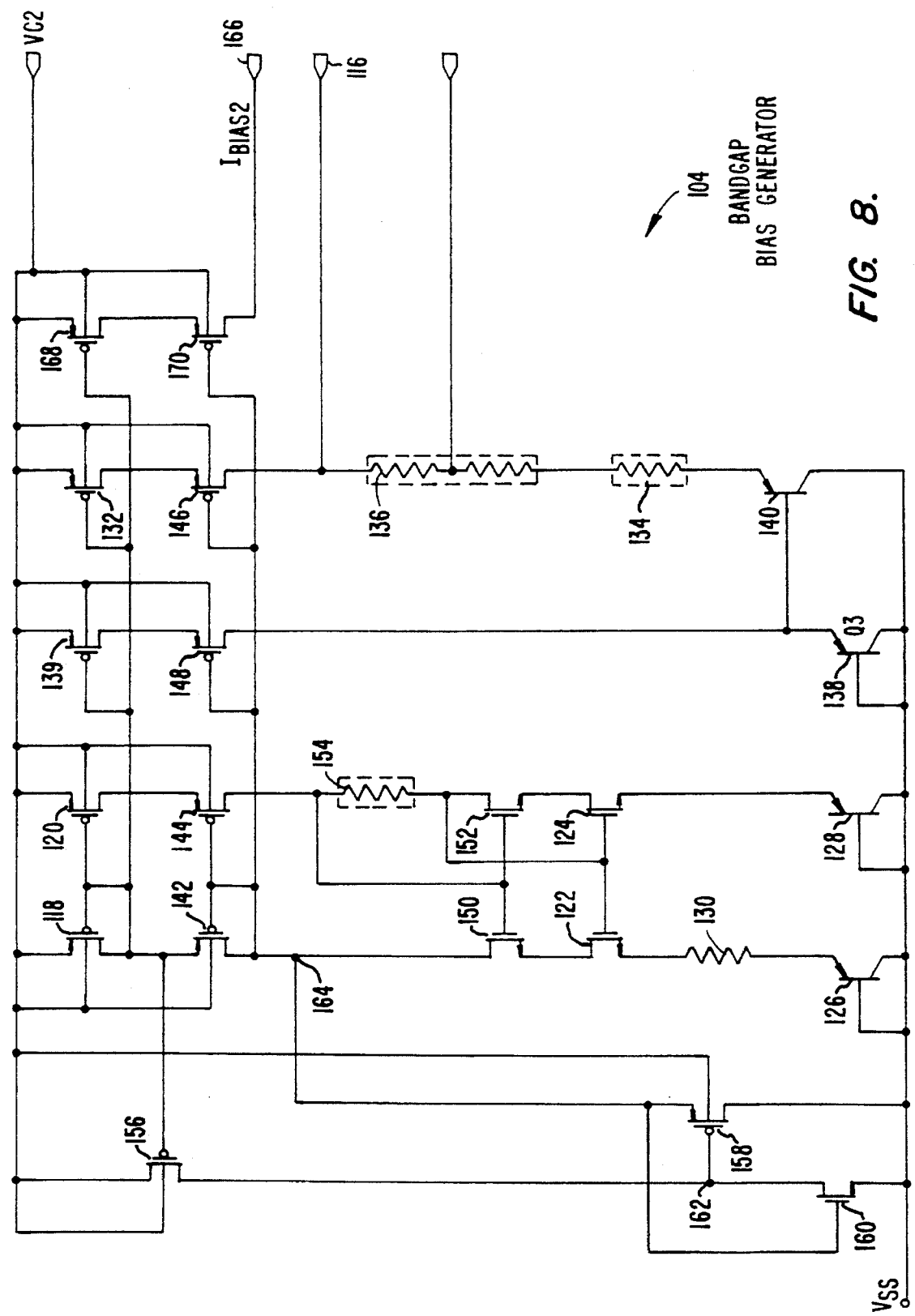
FIG. 8 is an electrical circuit diagram of a temperature compensation circuit for generating reference voltages in accordance with the present invention.

Bandgap bias generator 104 may be best understood by reference to FIG. 8. Bandgap bias generator 104 uses a technique for generating a reference voltage at output 116 that is based on the summing of two voltages with different temperature coefficients. One voltage increases as temperature increases (i.e., a positive temperature coefficient). The second voltage decreases as temperature increases (i.e., a negative temperature coefficient).

PMOS transistors 118, 120 and 132 together with NMOS transistors 122 and 124, PNP transistors 126 and 128 and resistors 130, 134 and 136 form a Proportional-To-Absolute Temperature (PTAT) voltage source. The PTAT voltage source generates a voltage with a positive temperature coefficient across resistor 130 which is mirrored and amplified by transistor 132 and resistors 134 and 136 to provide the first voltage. The temperature coefficient for the PTAT voltage source is approximately 3355 parts per million (ppm) per °C. at 25° C.

The base and emitter of parasitic PNP transistors 138 and 140 generate the second voltage with the negative temperature coefficient. Depending on process parameters, transistors 138 and 140 have a negative temperature coefficient of approximately −3400 ppm per °C. at 25° C. assuming constant collector current.

By setting the first voltage such that it is approximately equal to the second voltage, it is possible to minimize voltage variation at output 116 over the operating temperature range of the semiconductor device. However, one skilled in the art will understand that if the first voltage source is set such that it is larger than the second voltage source, the temperature compensation can be designed to have a positive temperature coefficient. Thus at higher operating temperatures, the positive temperature coefficient tends to maintain a constant switching speed or compensate for process variation that affects propagation delays. Accordingly, such positive temperature compensation is useful where critical timing paths demand have narrow tolerance windows.

The current mirror formed by transistors 118 and 120 biases transistors 126 and 128 with equal emitter current. However, in one especially preferred embodiment, the emitter area of transistor 126 is twelve times that of transistor 128. Accordingly, with different emitter areas, transistors 126 and 128 have a different base-to-emitter voltage for the same emitter current. As is well known in the art, the difference in base-emitter voltages, $\Delta V_{be}$, is determined by the ratio of the area of the emitter of transistor 126 to the area of the emitter of transistor 128, and is:

$$\Delta V_{be} = (kT/q) \left( \ln \frac{\text{(Emitter area of transistor 126)}}{\text{(Emitter area of transistor 128)}} \right) \quad (12)$$

In the preferred embodiment where transistor 126 has an emitter area twelve times that of transistor 128, $\Delta V_{be}$ at 25° C. is approximately 64 mV and is independent of collector current and is proportional to absolute temperature.

The operation of the PTAT voltage source is explained in conjunction with the description of the remaining portions of bandgap bias generator 104. Transistors 118 and 120 have the same dimensions and are connected as a current mirror with the gate of transistor 120 connected to the gate of 118 and to the drain of transistor 118. Since transistors 118 and 120 have the same dimensions and a common gate voltage, the current through each is equal, as is the emitter current of transistors 126 and 128. Since transistors 122 and 124 are saturated, have equal dimensions and have a common gate voltage, their sources are maintained at the same voltage. This implies that the difference in base-emitter voltage between transistors 126 and 128, i.e., $\Delta V_{be}$, is across resistor 130.

A current mirror comprising a transistor 132 having its gate connected in common with the gates of transistors 118 and 120 mirrors the current through each leg of the PTAT voltage source. This causes a voltage proportional to $\Delta V_{be}$ to appear across a pair of series resistors 134 and 136. By selecting appropriate values for resistors 134 and 136, it is possible to amplify $\Delta V_{be}$. In one preferred embodiment, the value of resistors 134 and 136 are 20.5 times that of resistor 130. Because the current provided by transistor 132 is the same as the current supplied by transistors 118 or 120, the voltage across resistors 134 and 136 will be 20.5 times as large as $\Delta V_{be}$. If $\Delta V_{be}$ is set to about 63.8 mV at 25° C., the voltage appearing across resistors 134 and 136 will be 1.308 volts. The overall temperature coefficient of bandgap bias generator 104 can be adjusted by changing the value of resistor 134.

Resistor 134 is connected to the emitter of a parasitic PNP transistor 140 that has its collector connected to $V_{ss}$ and its base connected the emitter of another parasitic PNP transistor 138. Transistor 138 is configured as a diode having its base and collector tied to $V_{ss}$. Transistor 138 is biased by another current source comprising transistor 139. Transistor 139 has its gate connected with the gates of transistors 118, 120 and 132 so that the current supplied by transistor 139 is equal to the currents sourced by transistors 118, 120 and 132. Although one skilled in the art could construct the current sources from any transistor type, it is preferred in the present embodiment that the current mirror transistors be PMOS transistors.

Because the base-emitter voltage of transistors 138 and 140 at 25° C. is approximately 0.625 volt (neglecting process variations), the total voltage across transistor 138, transistor 140, resistor 134 and resistor 136 is 1.308 volts plus 0.625 volts plus 0.625 volts or 2.558 volt which appears at output 116. Output 116 is connected to input 14 of amplifier 12 (FIG. 5). The voltage at output 116 thus drives voltage regulator buffer 71.

To eliminate supply voltage and process variations on the current sourced by the current mirrors in FIG. 8, it is advantageous to cascode each of the transistors configured as a current mirror. For this reason, p-channel cascode transistors 142, 144, 146 and 148 have a common gate terminal connected to the drain of transistor 142.

A cascode transistor pair comprising transistors 150 and 152 provide the cascode function for n-channel transistors 122 and 124 with the gate of transistor 150 connected to the gate of transistor 152. However, rather than biasing the gates of transistors 150 and 152 to the drain of the transistor 152, the gates are resistively coupled thereto by a bias resistor 154. This biasing configuration requires less supply voltage than would be required if the NMOS cascode transistors were biased in a similar manner to the PMOS transistors 118, 120, 142 and 144. Transistors 122 and 124 are biased by connecting their common gates to the drain of transistor 152. Since the current through resistor 154 is the same as the current through resistor 130, the voltage across resistor 154 is proportional to the voltage drop across resistor 130 (i.e., $\Delta V_{be}$). If $\Delta V_{be}$ is set to 63.8 mV, as in the example above, and resistor 154 is chosen to be about four times larger than resistor 130, or about 36 Kohms, the voltage across resistor 154 will be about 287 mV at 25° C. and transistors 122 and 124 will be operated in the saturated condition.

It should be noted that the bandgap reference generator 104 of FIG. 8 has an undesirable stable state under initial conditions when transistors 118, 120, 132 and 139 are "off" and no current flows. In this state, the voltage at voltage reference output 116 will remain at $V_{ss}$. Transistors 156, 158 and 160 are added to overcome this stable state. Transistor 160 is a weak device which is used to initially pull a node 162 low to $V_{ss}$. The low voltage on node 162 turns source follower transistor 158 "on" and thereby injecting current into the PTAT circuit at a node 164.

Once power has been applied and stabilized, it is necessary that transistor 158 be maintained in the "off" condition. To do so, transistor 156 turns on and overpowers transistor 160 so that transistor 158 switches to the "off" state. Thus, it is imperative that the dimensions of transistor 156 be sufficient to overpower transistor 160 under all process and operating conditions. In the preferred embodiment, the width-to-length (W/L) ratio of transistor 156 is several orders of magnitude greater than the width-to-length ratio of transistor 160.

Finally, bandgap bias generator 104 is provided with a bias current source that supplies a current, $I_{BIAS2}$, at output 166. This current is used to bias the current sources of voltage regulator buffer 71 and is approximately 8 μa at 25° C. The current is generated by a current mirror comprising transistor 168 and cascode transistor 170. The gate of transistor 168 is connected in common with transistors 118, 120, 132 and 139 while the gate of transistor 170 is connected in common with the gates transistors 142, 144, 146 and 148 at node 164.

Referring again to FIG. 7, regulator circuit 112 provides a temperature compensated, process independent, internal supply voltage that is referenced to $V_{ss}$ rather than the external power supply $V_{cc}$. The present invention advantageously employs the parasitic PNP transistors 126, 128, 138 and 140 to provide excellent supply voltage noise rejection.

However, in some CMOS processes, the parasitic PNP transistors 126, 128, 138 and 140 are insufficiently formed because of inherent process steps that degrade the effectiveness of the parasitic PNP transistors.

Thus, the present invention also includes means for providing an internal voltage that may be used to power internal logic at a selected power supply level derived from the external supply voltage independent from the regulated voltage generated by voltage regulator buffer 71. This second core logic power supply means, or pseudo-voltage regulator, is enabled by driving an input 172 to a high logic level. With input 172 high, bandgap bias generator 104 and voltage regulator buffer 71 are disabled. Specifically, with a high logic level on input 172, p-channel transistors 174, 176 and 178 are biased in the high impedance state and power is effectively removed from bandgap bias generator 104 and voltage regulator buffer 71. To ensure that bandgap bias generator 104 and voltage reference buffer 71 remain "off" and are not inadvertently switched on by noise on $V_{cc}$, the high logic level on input 172 switches N-channel transistors 180 and 182 to the "on" or conductive state thereby coupling nodes 184 and 186 to $V_{ss}$, as shown by the ground symbols in FIG. 7.

With bandgap bias generator 104 and voltage regulator buffer 71 disabled, transistor 188 selects the output of trim network 80 to directly drive the distributed NMOS source follower in the core logic of the semiconductor device. Transistor 190 couples node 192 (FIG. 6) directly to the external power supply $V_{cc}$. Thus the output of trim network 80 may be adjusted with control inputs 82–86 to an appropriate level for driving internal core logic of the semiconductor device.

Specifically, referring now to FIGS. 6 and 7, the voltage at node 92 can be adjusted in substantially linear steps to be in the range of $0.7*V_{cc}$ to $V_{cc}$. For the case of $V_{cc}$=5.0 V, internal core logic at node 92 can be adjusted to anywhere in the range from 5.0 V to 3.5 V. The minimum voltage, 3.5 V, may be selected by setting each control terminal 82–88 to the low state.

Enabling the second core logic power supply means is made possible by inverter 194. With input 172 at the high logic level, inverter 194 drives a node 196 low and P-channel transistor 188 switches to a low impedance state. In this manner, the voltage at node 92 of trim network 80 is provided to node 114 via transistor 188. It is interesting to note that the second core logic power supply means provides an internal core reference voltage at node 114 with little rejection of supply voltage variation.

In addition to the second core logic power supply means discussed above, regulator circuit 112 may be easily adapted to fuse programmable gate arrays, such as those described in U.S. Ser. No. 07/783,659, filed Oct. 28, 1991, and now U.S. Pat. No. 5,313,119 the disclosure of which is incorporated herein by reference. To adapt regulator circuit 112, inverter 200 and transistors 202 and 204 are provided to interface programming input 206. During normal operation of the semiconductor device, programming input 206 is held at a low logic level and the voltage at node 114 is provided at nodes 208 and 210. However, when programming input 206 switches to a high logic state, the voltage level at node 210 is driven low to $V_{ss}$. The voltage reference on node 208, however, remains constant and is unaffected by the logic level on programming input 206. In this manner, information stored in core logic gates remains unaffected while permitting field programming of the continuous series transistors discussed in the above-referenced application.

With a high logic state on programming input 206, transistor 204 is "off". Inverter 200 drives node 212 to $V_{ss}$ and transistor 202 is conducting thereby pulling node 210 to $V_{ss}$. Capacitor 110 provides glitch protection at node 40 so that as programming input 206 transitions from a high logic level to a low logic level, glitches caused by capacitive charge sharing are absorbed by capacitor 110.

Although preferred embodiments of the invention have been described in detail, it is understood that the invention is not limited to the embodiments disclosed, but is capable of numerous modifications and substitutions of parts and element without departing from the spirit of the invention. For example, the embodiments disclosed above may be advantageously incorporated into any type of semiconductor device although the examples provided herein are directed primarily toward circuits which employ both NMOS and PMOS logic devices.

What is claimed is:

1. In a semiconductor circuit having a plurality of circuit elements, a voltage regulator comprising:

a frequency compensated differential amplifier for generating a regulated voltage and having paired first and second self-biased input cascode transistors;

a configurable resistive feedback network for setting the gain of said voltage regulator; and a plurality of source follower devices connected in parallel for buffering the output of said amplifier; a first of said source follower devices adapted for driving said feedback network and the remaining source follower devices adapted for providing a regulated supply voltage to said circuit elements.

2. The semiconductor circuit of claim 1 wherein said amplifier further comprises:

a current source; and third, fourth, fifth and sixth transistors; said first and second transistors each having a threshold voltage that is less than the threshold voltage of said fifth and sixth transistors; the sources of said third and fourth transistors coupled to a power bus; the gate of said third transistor connected to the gate of said fourth transistor and to the drain of said third transistor; the drain of said third transistor further connected to the drain of said first transistor; the gate of said first transistor connected to the gate of said fifth transistor and to a bias voltage; the source of said first transistor connected to the drain of said fifth transistor; the sources of said fifth transistor and said sixth transistor connected at a common node and coupled to ground through said current source; the drain of said fourth transistor connected to the drain of said second transistor and to said first source follower device; the source of said second transistor connected to the drain of said sixth transistor; the gates of said second and sixth transistors connected at a common node and further connected to said feedback network.

3. In a semiconductor device having a plurality of core logic elements, a circuit for generating a regulated power supply voltage substantially independent of an external power supply comprising:

a differential amplifier having self-biasing input pair cascode transistors, a feedback network for setting the gain of said amplifier coupled to one input of said amplifier, a plurality of source follower devices for buffering the output of said amplifier, one of said source follower devices adapted for driving said feedback network and the remaining source follower devices adapted for providing a regulated supply voltage to said semiconductor device, and a frequency compensation capacitor coupled between the output of said amplifier and the ground reference; and a bandgap generator for generating a reference bias voltage coupled to another input of said amplifier; said bandgap generator having a proportional- to-absolute temperature voltage source for generating a substantially temperature-independent reference bias voltage.

4. The semiconductor device of claim 3 wherein said proportional-to-absolute temperature voltage source further comprises circuit means for eliminating initial stable states where said reference bias voltage is held low after application of said external voltage.

5. The semiconductor device of claim 3 wherein said proportional-to-absolute temperature voltage source comprises a first and second pair of self-biased cascode MOS transistors each coupled to a first voltage supply by a current mirror and to the reference voltage source by transistors means adapted for providing a negative temperature coefficient.

6. The semiconductor device of claim 5 wherein said first and second pairs of self-biased cascode transistors comprise a first and second transistor, each having a first threshold voltage, and a third and fourth transistor having a second threshold voltage; the gates of said first and second transistors coupled to the drain of said fourth transistor; the gates of said third and fourth transistors resistively coupled to the drain of said fourth transistor by a bias resistor.

7. The semiconductor device of claim 3 wherein each of said self-biased input pair cascode transistors comprise a first and second transistor of the same conductivity type having different threshold voltages.

8. In a semiconductor device having a plurality of logic elements, a circuit for generating a regulated power supply voltage substantially independent of an external power supply comprising:

a differential amplifier having self-biasing input pair cascode transistors, a configurable resistive feedback network for setting the gain of said amplifier coupled to one input of said amplifier, a plurality of source follower devices for buffering the output of said amplifier, one of said source follower devices adapted for driving said feedback network and the remaining source follower devices adapted for providing a regulated supply voltage to said logic elements, and a frequency compensation capacitor coupled between the output of said amplifier and the ground reference; and a bandgap generator for generating a reference bias voltage coupled to another input of said amplifier, said reference bias voltage having a positive temperature dependence;

whereby said logic elements maintain a constant switching speed as temperature increases.

9. The semiconductor device of claim 8 wherein said bandgap generator has a first voltage source having a positive temperature dependence and a second voltage source having a negative temperature dependence, said first and second voltage sources summed together for generating reference bias voltage, said first voltage source larger than said second voltage source to dominate said second voltage source whereby said reference bias voltage has a positive temperature dependence.

10. The semiconductor device of claim 9 wherein said second voltage source comprises at least one bipolar transistor connected to supply a base-emitter voltage from ground.

* * * * *